(12) United States Patent
Kang et al.

(10) Patent No.: US 7,928,000 B2
(45) Date of Patent: Apr. 19, 2011

(54) METHOD FOR FORMING SELF ALIGNED CONTACTS FOR INTEGRATED CIRCUIT DEVICES

(75) Inventors: Jin Kang, Shanghai (CN); Mingching Wang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 558 days.

(21) Appl. No.: 11/697,287

(22) Filed: Apr. 5, 2007

(65) Prior Publication Data
US 2008/0153294 A1    Jun. 26, 2008

(30) Foreign Application Priority Data
Dec. 20, 2006 (CN) .......................... 2006 1 0147850

(51) Int. Cl.
*H01L 21/4763* (2006.01)
(52) U.S. Cl. ........ 438/622; 438/623; 438/637; 438/704; 438/705; 438/723; 438/724
(58) Field of Classification Search .................. None
See application file for complete search history.

(56) References Cited

U.S. PATENT DOCUMENTS
4,961,820 A * 10/1990 Shinagawa et al. ............ 438/725
6,100,202 A *  8/2000 Lin et al. ....................... 438/734

OTHER PUBLICATIONS
Wolf et al., Silicon Processing for the VLSI Era, pp. 514-517, 1986.*
* cited by examiner

*Primary Examiner* — Duy-Vu N Deo
(74) *Attorney, Agent, or Firm* — Kilpatrick Townsend and Stockton LLP

(57) ABSTRACT

A method for processing integrated circuit devices including forming self aligned contact regions. The method includes providing a partially completed semiconductor wafer, the wafer including one or more semiconductor chips, where each of the chips including a plurality of MOS gate structures. Each of the gate structures is formed on a substrate and having a first layer of silicon nitride formed overlying portions including a contact region between the gate structures. Each of the chips has conformal layer of doped silicon glass of a predetermined thickness overlying the silicon nitride layer and the gate structures. The method then applies a plasma etching process to the doped silicon glass to expose a portion of the first silicon nitride layer using an anisotropic etching component to vertically remove portions of the doped silicon glass. A step of cleaning the exposed portion of silicon nitride using an isotropic component is also included. The method forms a second silicon nitride layer on the exposed portion of the second silicon nitride layer and removes the second silicon nitride layer and exposed portion of the first silicon nitride layer to expose the contract region on the substrate. The method processes the exposed contact region using a soft etching technique.

10 Claims, 3 Drawing Sheets

BPSG Etch    SiN Soft Etch    Liner SiN Etch

METHOD FOR FORMING SELF ALIGNED CONTACTS FOR INTEGRATED CIRCUIT DEVICES

CROSS-REFERENCES TO RELATED APPLICATIONS

This application claims priority to Chinese Application No. 200610147850.X; filed on Dec. 20, 2006; commonly assigned, and of which is hereby incorporated by reference for all purposes.

BACKGROUND OF THE INVENTION

The present invention is directed integrated circuits and their processing for the manufacture of semiconductor devices. More particularly, the invention provides a method for forming small features such as contacts for integrated circuit device structures. But it would be recognized that the invention has a much broader range of applicability. For example, the invention can be applied to a variety of devices such as dynamic random access memory devices (DRAM), static random access memory devices (SRAM), application specific integrated circuit devices (ASIC), microprocessors and microcontrollers, Flash memory devices, and others.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is the ability to remove a layer and form a patterned structure, which is used as a contact region. The contract region should be free and clear from undesirable materials that cause electrical resistance.

As merely an example, patterning and etching processes are often used to remove or partially remove a layer to form contact structures therefrom. An etching tool such as a dry or wet etcher often performs etching. The wet etcher often includes a vessel that has an etchant chemical to selectively remove one material from another material. The dry etcher often includes a plasma source and treatment chamber. The dry etcher often uses gases such as fluorine bearing species and chlorine bearing species to remove semiconductor materials such as silicon or metal such as aluminum. Unfortunately, etching is often not precise. Etching also often does not remove all materials from contact regions, which lead to undesirable resistance between contact regions and overlying metal layers. Such resistance is often difficult to see or even detect until the device has been completely fabricated. The defective device often results in yield loss and reliability problems of the device. Such defects are often difficult to uncover during processing and even more difficult to correct after detection such conventional semiconductor devices often goes through hundreds of processes that may lead to such defects.

From the above, it is seen that an improved technique for processing semiconductor devices is desired.

BRIEF SUMMARY OF THE INVENTION

According to the present invention, techniques including methods for the manufacture of semiconductor devices are provided. More particularly, the invention provides a method for forming small features such as contacts for integrated circuit device structures. But it would be recognized that the invention has a much broader range of applicability. For example, the invention can be applied to a variety of devices such as dynamic random access memory devices (DRAM), static random access memory devices (SRAM), application specific integrated circuit devices (ASIC), microprocessors and microcontrollers, Flash memory devices, and others.

In a specific embodiment, the invention provides a method for processing integrated circuit devices including forming self aligned contact regions. The method includes providing a partially completed semiconductor wafer, the wafer including one or more semiconductor chips, where each of the chips including a plurality of MOS gate structures. Each of the gate structures is formed on a substrate and having a first layer of silicon nitride formed overlying portions including a contact region between the gate structures. Each of the chips has conformal layer of doped silicon glass of a predetermined thickness overlying the silicon nitride layer and the gate structures. The method then applies a plasma etching process to the doped silicon glass to expose a portion of the first silicon nitride layer using an anisotropic etching component to vertically remove portions of the doped silicon glass. A step of cleaning the exposed portion of silicon nitride using an isotropic component is also included. The method forms a second silicon nitride layer on the exposed portion of the second silicon nitride layer and removes the second silicon nitride layer and exposed portion of the first silicon nitride layer to expose the contract region on the substrate. The method processes the exposed contact region using a soft etching technique.

In an alternative specific embodiment, the invention provides a method for processing integrated circuit memory devices. The method includes providing a partially completed semiconductor wafer, which has one or more semiconductor chips. Each of the chips includes a plurality of MOS gate structures. Each of the gate structures is formed on a substrate and has a first layer of silicon nitride formed overlying portions including a contact region between the gate structures. Each of the chips has conformal layer of doped silicon glass of a predetermined thickness overlying the silicon nitride layer and the gate structures. The method applies a plasma etching process to the doped silicon glass to expose a portion of the first silicon nitride layer using an anisotropic etching component to vertically remove portions of the doped silicon glass to expose the first silicon nitride layer. The method also cleans the exposed portion of silicon nitride using an isotropic component. The method removes a predetermined thickness of the exposed portion of the first silicon nitride layer to increase a spacing dimension in the contact region in a vicinity of at least a lower portion between a first gate structure and a second gate structure. The first gate structure and the second gate structure are from the gate structures. The method also removes a portion of the exposed first silicon nitride layer in the contact region to expose the contract region on the substrate. A step of processing the exposed contact region is also included.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention can be applied to a variety of applications such as memory, ASIC, microprocessor, and other devices. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

Figure 1:
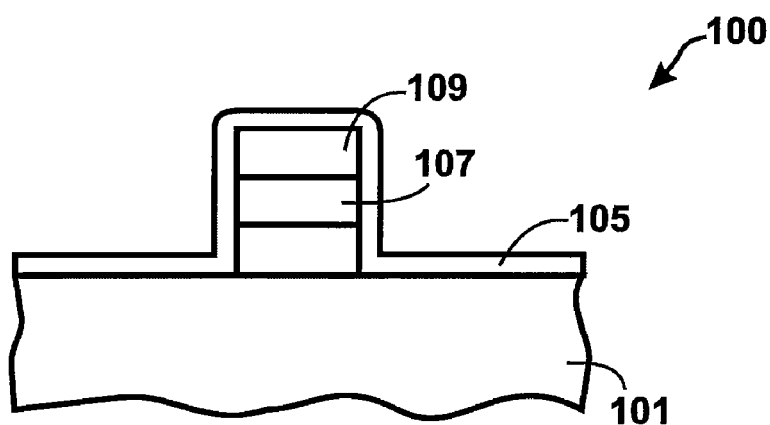
FIGS. 1 through 6 illustrate a method according to an embodiment of the present invention.

According to the present invention, techniques including methods for the manufacture of semiconductor devices are provided. More particularly, the invention provides a method for forming small features such as contacts for integrated circuit device structures. But it would be recognized that the invention has a much broader range of applicability. For example, the invention can be applied to a variety of devices such as dynamic random access memory devices (DRAM), static random access memory devices (SRAM), application specific integrated circuit devices (ASIC), microprocessors and microcontrollers, Flash memory devices, and others.

A conventional method may be outlined as follows:
1. Provide semiconductor substrate;
2. Form patterned MOS gate structures on substrate;
3. Form silicon nitride layer on MOS gate structures;
4. Form conformal BPSG (borophosphosilicate glass) layer overlying silicon nitride layer;
5. Perform BPSG etch to form contact openings;
6. Perform silicon nitride etch;
7. Perform liner silicon nitride etch to expose substrate contact portion;
8. Form contact metallization on exposed substrate contact portion, while certain portions of the nitride liner remain to cause added resistance to the contact region; and
9. Perform other steps, as desired.

The above sequence of steps provides a conventional method of performing contact formation. Such conventional method, however, leaves residual nitride bearing material on the contact region. The nitride bearing material causes added resistance, which leads to bit failures for memory related devices. Other limitations also exist with this conventional method. These and other limitations are resolved using the present invention, which has been described throughout the present specification and more particularly below.

A method according to an embodiment of the present invention may be outlined as follows:
1. Provide substrate;
2. Form patterned MOS gate structures on substrate;
3. Form silicon nitride layer on MOS gate structures;
4. Form a planarized BPSG layer overlying silicon nitride layer;
5. Perform BPSG etch without pattern to form contact region and stop on silicon nitride;
6. Clean opening from BPSG etch in contact region using asher/stripper;
7. Etch portion of silicon nitride layer and open bottom portion of contact region without damaging the substrate using hot $H_3PO_4$;
8 Grow second silicon nitride liner;
9. Perform liner silicon nitride etch to expose substrate contact region;
10. Perform soft etch on exposed substrate contact region; and
11. Perform other steps, as desired.

The above sequence of steps provides a method according to an embodiment of the present invention. As shown, the method uses a combination of steps including a way of forming an improved contact region for a self aligned contact in a dynamic random access memory device. Other alternatives can also be provided where steps are added, one or more steps are removed, or one or more steps are provided in a different sequence without departing from the scope of the claims herein. Further details of the present method can be found throughout the present specification and more particularly below.

A method according to an alternative embodiment of the present invention may be outlined as follows:
1. Provide substrate;
2. Form patterned MOS gate structures on substrate;
3. Form silicon nitride layer on MOS gate structures;
4. Form a planarized BPSG layer overlying silicon nitride layer;
5. Perform BPSG etch without pattern to form contact region;
6. Clean opening from BPSG etch in contact region;
7. Selective wet etch portion of silicon nitride layer and open bottom portion of contact region without damaging the substrate;
8. Grow back silicon nitride linear on etched portions;
9. Perform liner silicon nitride etch to expose substrate contact region;
10. Perform soft etch on exposed substrate contact region; and
11. Perform other steps, as desired.

The above sequence of steps provides a method according to an embodiment of the present invention. As shown, the method uses a combination of steps including a way of forming an improved contact region for a self aligned contact in a dynamic random access memory device. Other alternatives can also be provided where steps are added, one or more steps are removed, or one or more steps are provided in a different sequence without departing from the scope of the claims herein. Further details of the present method can be found throughout the present specification and more particularly below.

A method according to yet an alternative embodiment of the present invention may be outlined as follows:
1. Provide substrate;
2. Form patterned MOS gate structures on substrate, each of the MOS gate structures having a TEOS spacer thereon;

3. Form silicon nitride layer on each of the MOS gate structures;

4. Form a planarized BPSG layer overlying silicon nitride layer;

5. Perform BPSG etch without pattern to form contact region and stop on silicon nitride layer;

6. Clean opening from BPSG etch in contact region using asher/stripper;

7. Perform soft etch on stop silicon nitride to reduce a thickness of the silicon nitride layer and to enlarge a critical dimension at a lower region of the contact region with high selectivity to TEOS and does not damage the underlying substrate using an isotropic etching component;

8. Perform liner silicon nitride etch to expose substrate contact region using an anisotropic etching component;

9. Perform soft etch on exposed substrate contact region; and

10. Perform other steps, as desired.

The above sequence of steps provides a method according to an embodiment of the present invention. As shown, the method uses a combination of steps including a way of forming an improved contact region for a self aligned contact in a dynamic random access memory device. Other alternatives can also be provided where steps are added, one or more steps are removed, or one or more steps are provided in a different sequence without departing from the scope of the claims herein. Further details of the present method can be found throughout the present specification and more particularly below.

FIGS. 1 through 6 are simplified diagrams illustrating methods for fabricating a contact region for a dynamic random access memory device according to an embodiment of the present invention. This diagram is merely an example, which should not unduly limit the scope of the claims herein. One of ordinary skill in the art would recognize many variations, modifications, and alternatives. As shown, the invention provides a method for processing integrated circuit devices including forming self aligned contact regions. The method includes providing a partially completed semiconductor wafer 100. As shown, the wafer including one or more semiconductor chips, where each of the chips includes a plurality of MOS gate structures. Each of the gate structures is formed on a substrate 101 (e.g., silicon wafer) and has a first layer of silicon nitride 105 formed overlying portions including a contact region between the gate structures. Each of the gate structure can also include a cap layer 109 and metal layer 107. Optionally, each of the gate structures can include sidewall spacers made of suitable materials such as silicon dioxide, silicon nitride, TEOS, and others. Of course, one of ordinary skill in the art would recognize other variations, modifications, and alternatives.

Figure 2:
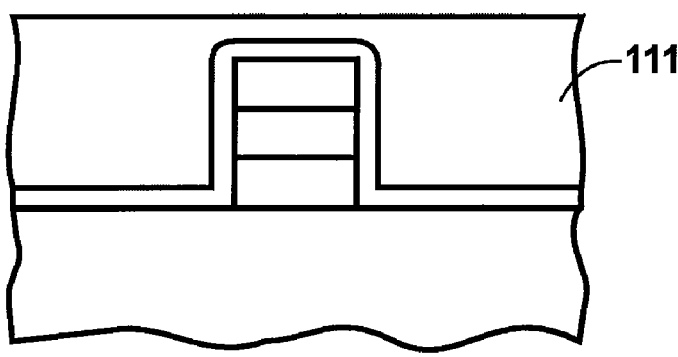

Referring to FIG. 2, each of the chips has conformal layer of doped silicon glass 111 of a predetermined thickness overlying the silicon nitride layer and the gate structures. The conformal layer is substantially free from pin holds and is planarized. The layer has been planarized using reflow techniques, chemical mechanical planarization techniques, and/or resist etch back, among others. The glass layer can be borophosphosilicate glass (BPSG), phosphosilicate glass (PSG), fluorinated silicate glass (FSG) using a combination of high density and low density plasma processing techniques. Of course, one of ordinary skill in the art would recognize many variations, modifications, and alternatives.

Figure 3:
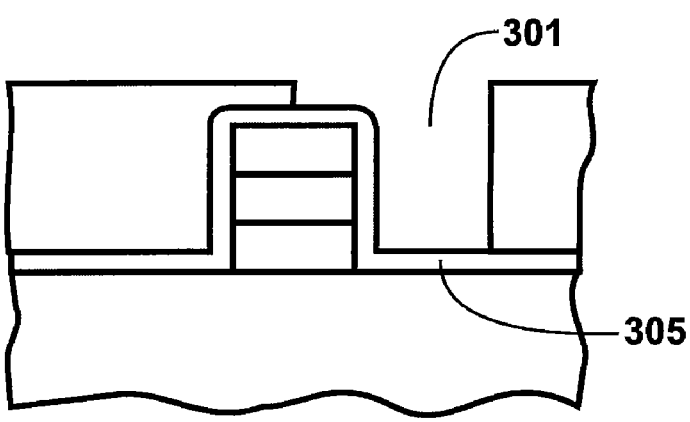

The method then applies a plasma etching process to the doped silicon glass to expose a portion of the first silicon nitride layer using an anisotropic etching component to vertically remove portions of the doped silicon glass, as illustrated by the simplified diagram of FIG. 3. As shown, a contact opening 301 has been formed to expose nitride etch stop layer 305. The etching is provided using a fluorine bearing species such as $C_4F_8$ or $CH_2F_2$ or any other suitable gas or combination of gases depending upon the specific embodiment.

Figure 4:
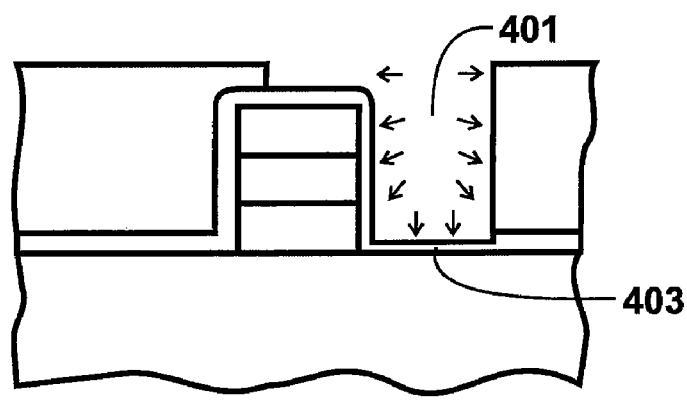

Referring now to FIG. 4, the method performs cleaning 401 the exposed portion of silicon nitride including a silicon nitride layer 403 overlying the substrate using an isotropic component. The isotropic component may be provided using an asher/stripper tool and selected gas chemistries. The tool can be from a downstream plasma source, which reduces any unwanted charged particles that can lead to damage of the contact region. Depending upon the embodiment, the plasma source can use an oxygen bearing species and a fluorine bearing species as well as other suitable chemistries.

Figure 5:
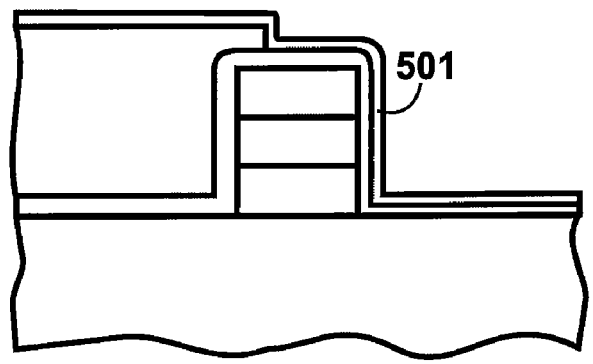
Figure 6:
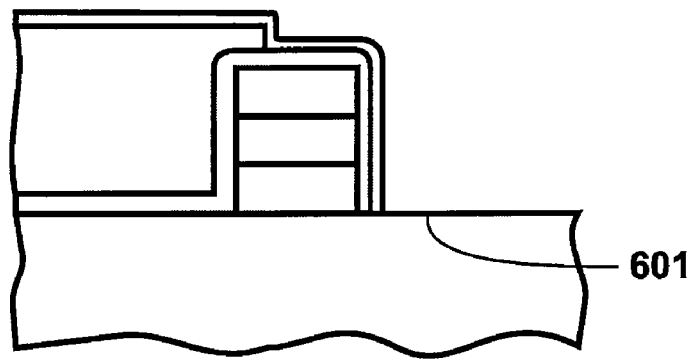

The method forms a second silicon nitride layer 501 on the exposed portion of the silicon nitride layer as shown in FIG. 5. The second silicon nitride layer is formed using a deposition technique. Such deposition technique uses silane bearing species and ammonium bearing species. As merely an example, such technique uses LPCVD. The second nitride layer has a thickness of about 15 nm and less. The method then removes the second silicon nitride layer and exposed portion of the first silicon nitride layer to expose the contract region 601 on the substrate, as illustrated by the simplified diagram of FIG. 6. The method processes the exposed contact region using a soft etching technique. The soft etching technique is characterized by an isotropic component and may be provided using an asher/stripper tool and selected gas chemistries. The tool can be from a downstream plasma source, which reduces any unwanted charged particles that can lead to damage of the contact region. Depending upon the embodiment, the plasma source can use an oxygen bearing species and a fluorine bearing species as well as other suitable chemistries.

The above sequence of steps provides a method according to an embodiment of the present invention. As shown, the method uses a combination of steps including a way of forming an improved contact region for a self aligned contact in a dynamic random access memory device. Other alternatives can also be provided where steps are added, one or more steps are removed, or one or more steps are provided in a different sequence without departing from the scope of the claims herein. Further details of the present method can be found throughout the present specification and more particularly below.

EXAMPLES

To prove the principle and operation of the present invention, we performed experiments using 0.2 micron processing of dynamic random access memory devices. These devices were prepared using the techniques described above, and included the contact regions, which were self aligned. The contact regions were made using the following recipe, which should not in any way unduly limit the scope of the claims herein.

1. Provide partially completed gate structure including nitride layer and TEOS sidewall spacers on a silicon substrate;

2. Form overlying BPSG layer, which is planarized;

3. Form mask pattern overlying BPSG layer;

4. Use plasma etcher to etch BPSG and stop on silicon nitride layer using the photomask pattern to form a contact region;

5. Strip photomask;

6. Perform cleaning step on the contact region;

7. Use downstream tool (i.e., reticle tool) to softly etch stop silicon nitride in the contact region to reduce a thickness of the silicon nitride and enlarge a bottom critical dimension, which is highly selective to TEOS and does not damage the substrate via isotropic etch component;

8. Plasma etch to open thinner silicon nitride on a bottom portion of the contact region and stop on the silicon substrate, which can get larger bottom critical dimension without much damage or less on the exposed silicon portion on the contact region via anisotropic etch component;

9. Perform soft etch on the exposed silicon contact region using the reticle tool; and 10. Perform other steps, as desired.

Figure 7:
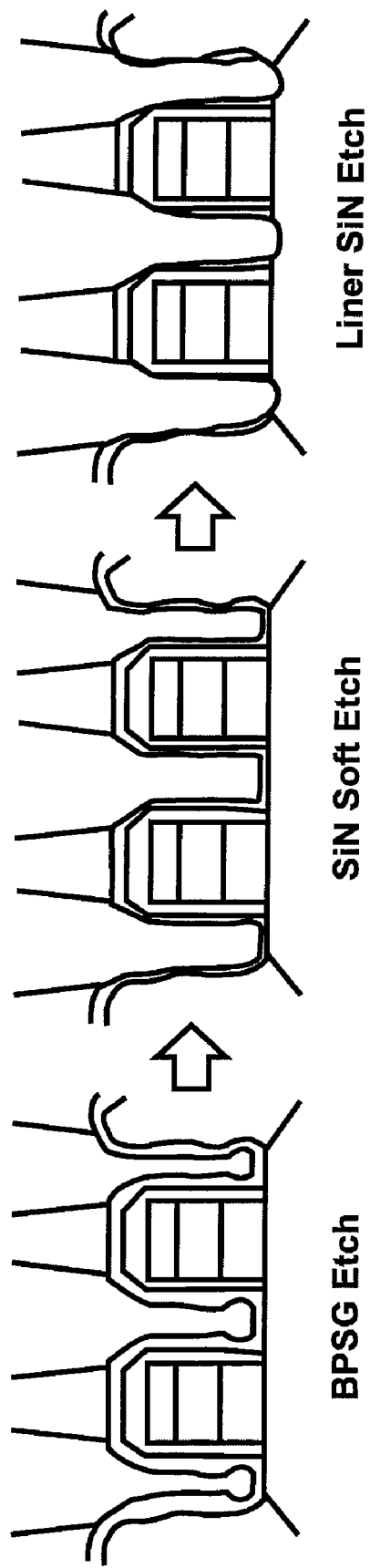
FIG. 7 illustrates simplified diagrams of certain experimental results according to an alternative embodiment of the present invention.

FIG. 7 illustrates simplified diagrams 700 of certain experimental results according to an alternative embodiment of the present invention. This diagram is merely an illustration and should not unduly limit the scope of the invention herein. One of ordinary skill would recognize many other variations, modifications, and alternatives. As shown, the results include a clean contact opening without much loss to the silicon material using the present method according to a specific embodiment. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for processing integrated circuit devices including forming self aligned contact regions, the method comprising:

providing a partially completed semiconductor wafer, the wafer including one or more semiconductor chips, each of the chips including a plurality of MOS gate structures, each of the gate structures being formed on a substrate and having a first layer of silicon nitride formed overlying portions including a contact region between the gate structures, each of the chips having conformal layer of doped silicon glass of a predetermined thickness overlying the silicon nitride layer and the gate structures;

applying a plasma etching process to the doped silicon glass to expose a portion of the first silicon nitride layer using an anisotropic etching component to vertically remove portions of the doped silicon glass;

cleaning the exposed portion of silicon nitride using an isotropic component;

forming a second silicon nitride layer on the exposed portion of the first silicon nitride layer;

removing the second silicon nitride layer and exposed portion of the first silicon nitride layer to expose the contact region on the substrate; and processing the exposed contact region.

2. The method of claim 1 wherein the cleaning is provided using a stripping process and a wet etching process.

3. The method of claim 2 wherein the wet etching process uses H3PO4 species.

4. The method of claim 2 wherein the wet etching process is maintained at a temperature of about 160 degrees C.

5. The method of claim 1 wherein the doped silicon glass is BPSG, PSG, FSG, or other material.

6. The method of claim 1 wherein the processing is provided using a down stream reticle tool.

7. The method of claim 1 wherein the cleaning is provided by a wet etchant.

8. The method of claim 1 wherein the contact region has a dimension of about 0.35 micron and less.

9. The method of claim 1 wherein the cleaning is a stripping process.

10. The method of claim 1 wherein the applying the plasma etch process is through a patterned mask overlying the doped silicon glass.

* * * * *